(12) United States Patent
Moscaluk

(10) Patent No.: US 7,746,159 B1
(45) Date of Patent: Jun. 29, 2010

(54) POLARITY CONVERSION CIRCUIT

(75) Inventor: Gary Moscaluk, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 266 days.

(21) Appl. No.: 11/756,832

(22) Filed: Jun. 1, 2007

Related U.S. Application Data

(60) Provisional application No. 60/811,652, filed on Jun. 6, 2006.

(51) Int. Cl.
*G01R 19/00* (2006.01)
*H01L 35/00* (2006.01)

(52) U.S. Cl. ........................................ 327/513; 327/28

(58) Field of Classification Search .................. 327/28, 327/356, 374–377, 424, 437, 512, 513
See application file for complete search history.

(56) References Cited

U.S. PATENT DOCUMENTS

| | | | | |
|---|---|---|---|---|
| 5,349,562 | A | * 9/1994 | Tanizaki | 365/222 |
| 6,181,179 | B1 | * 1/2001 | Kanba | 327/202 |
| 6,608,513 | B2 | * 8/2003 | Tschanz et al. | 327/218 |

* cited by examiner

*Primary Examiner*—Dinh T. Le

(57) ABSTRACT

Disclosed is a process, voltage and temperature compensated polarity conversion circuit comprising an input signal generator comprising an input signal having a first polarity, a variable frequency generator, a plurality of high voltage differential switches coupled to the variable frequency generator and a controllable threshold transmission gate circuit coupled to the input signal generator, coupled to the variable frequency generator and coupled to the plurality of high voltage differential switches. A method of polarity conversion and other embodiments are also disclosed.

12 Claims, 5 Drawing Sheets

POLARITY CONVERSION CIRCUIT

CROSS-REFERENCE TO RELATED APPLICATIONS

The present application claims the benefit of priority under 35 U.S.C. 119(e) to U.S. Provisional Patent Application. Ser. No. 60/811,652, entitled A Process, Voltage and Temperature Variation Compensated Polarity Conversion Circuit; which application is hereby incorporated by reference.

TECHNICAL FIELD

The present invention relates to polarity conversion circuits generally and, more particularly to a voltage polarity conversion circuit, which is compensated for variations in Process, Voltage and Temperature (PVT).

BACKGROUND

Operating characteristics of semiconductor devices change under a variety of conditions often referred to as process, voltage, temperature (PVT) variations. The PVT variations may be variations in manufacturing process or variations in operating conditions such as junction temperature/ambient temperature and supply voltage levels. Process variations are determined at time of manufacture of the semiconductor device, while temperature and voltage variations occur while the semiconductor device is in use.

A collection of process, voltage and temperature parameters or conditions is referred to as a PVT corner or a silicon corner. Operating characteristics of a semiconductor device may vary across PVT corners. For a particular PVT corner/silicon corner if a device exhibits different operating characteristics under different supply voltage conditions, then the device is said to exhibit voltage variations. For a particular silicon corner if a device exhibits different operating characteristics under different temperature conditions, then the device is said to exhibit temperature variations.

Conventional portable electronic devices such as a radio hand set, a cellular phone or a personal digital assistant use a battery as a power source. In such electronic devices, the battery should be inserted with its polarities matching with the positive terminal (+) and negative terminal (−) of the power supply input. If the battery is inserted with the polarities (+) and (−) inverted in the portable electronic device, the inverted battery may cause internal circuits to operate improperly, shorten the life of the electronic device, or it can also damage the electronic device.

Referring to FIG. 1, a conventional automatic polarity conversion circuit 100 is disclosed. The conventional polarity conversion circuit 100 comprises a first input terminal 110, a second input terminal 120, a converter 130, a first output terminal 140 and a second output terminal 150. The first input terminal 110 and second input terminal 120 receive a first input signal and a second input signal respectively. The first input signal has a first polarity and the second input signal has a second polarity. The converter 130 converts the first input signal and second input signal into a first output signal and a second output signal respectively, wherein the first and second output signals have predetermined first output polarity and second output polarity respectively. The first output terminal 140 outputs a first signal and the second output terminal 150 outputs a second signal.

The converter 130 comprises a first transmission gate T1, a second transmission gate T2, a third transmission gate T3 and a fourth transmission gate T4. The first transmission gate T1 is constituted by a PMOS (P-channel Metal Oxide Semiconductor) transistor 10 and a NMOS (N-channel Metal Oxide Semiconductor) transistor 12 coupled to each other. The first transmission gate T1 comprises an input port, which is coupled to the first input terminal 110 and it comprises an output port, which is coupled to the first output terminal 140. The second transmission gate T2 comprises a PMOS transistor 14 and a NMOS transistor 16 coupled together. The second transmission gate T2 comprises an input port, which is coupled to the first input terminal 110 and it comprises an output port, which is coupled to the second output terminal 150. The third transmission gate comprises a PMOS transistor 18 and a NMOS transistor 20 coupled together. The third transmission gate T3 comprises an input port, which is coupled to the second input terminal 120 and it comprises an output port, which is coupled to the first output terminal 140. The fourth transmission gate comprises a PMOS transistor 22 and a NMOS transistor 24 coupled together. The fourth transmission gate T4 comprises an input port, which is coupled to the second input terminal 120 and it comprises an output port, which is coupled to the second output terminal 150.

A gate terminal of the NMOS transistor 12 is coupled to the first input terminal 110 and a gate terminal of the PMOS transistor 10 is coupled to the second input terminal 120. A gate terminal of the NMOS transistor 16 is coupled to the second input terminal 120 and a gate terminal of the PMOS transistor 14 is coupled to the first input terminal 110. A gate terminal of the NMOS transistor 20 is coupled to the second input terminal 120 and a gate terminal of the PMOS transistor 18 is coupled to the first input terminal 110. A gate terminal of the NMOS transistor 24 is coupled to the first input terminal 110 and a gate terminal of the PMOS transistor 22 is coupled to second input terminal 120.

Referring to FIG. 2, a flow chart 200 illustrates the operation of the conventional automatic polarity converter 100. In a first step 210, a first input signal having a first polarity is received by the first input terminal 110 and a second input signal having a second polarity is received by the second input terminal 120. In a second step 220, the first input signal is transferred to the first output terminal 140 through the first transmission gate T1, wherein the first input signal has a positive polarity (−). In a third step 230, the first input signal is transferred to the second output terminal 150 through the second transmission gate T2, wherein the first input signal has a negative polarity (−). In a fourth step 240, the second input signal is transferred to the first output terminal 140 through the third transmission gate T3, wherein the second input signal has a positive (+) polarity. In a fifth step 250, the second input signal is transferred to the second output terminal 150 through the fourth transmission gate 14, wherein the second input signal has a negative (−) polarity.

A disadvantage of the conventional automatic polarity conversion circuit is that the transmission gates used do not have threshold voltage adjustment features for minimizing output voltage variation over Process, Voltage and Temperature parameters.

A conventional method for polarity conversion is a flyback method, wherein opposite charge is pumped into circuit nodes and charge is trapped wherever polarity change is required. A disadvantage of the conventional flyback method is that flyback circuit parameters experience a large variation over process, voltage and temperature besides the critical timing problem for charge pumping and charge trapping.

It is therefore desirable that a polarity conversion circuit be devised, which is self-compensated for variations in Process, Voltage and Temperature (PVT).

DETAILED DESCRIPTION

Embodiments of the present invention are discussed below in conjunction with the figures. The embodiments set forth a process, voltage and temperature (PVT) compensated polarity conversion circuit, shown in FIG. 3.

Figure 1:
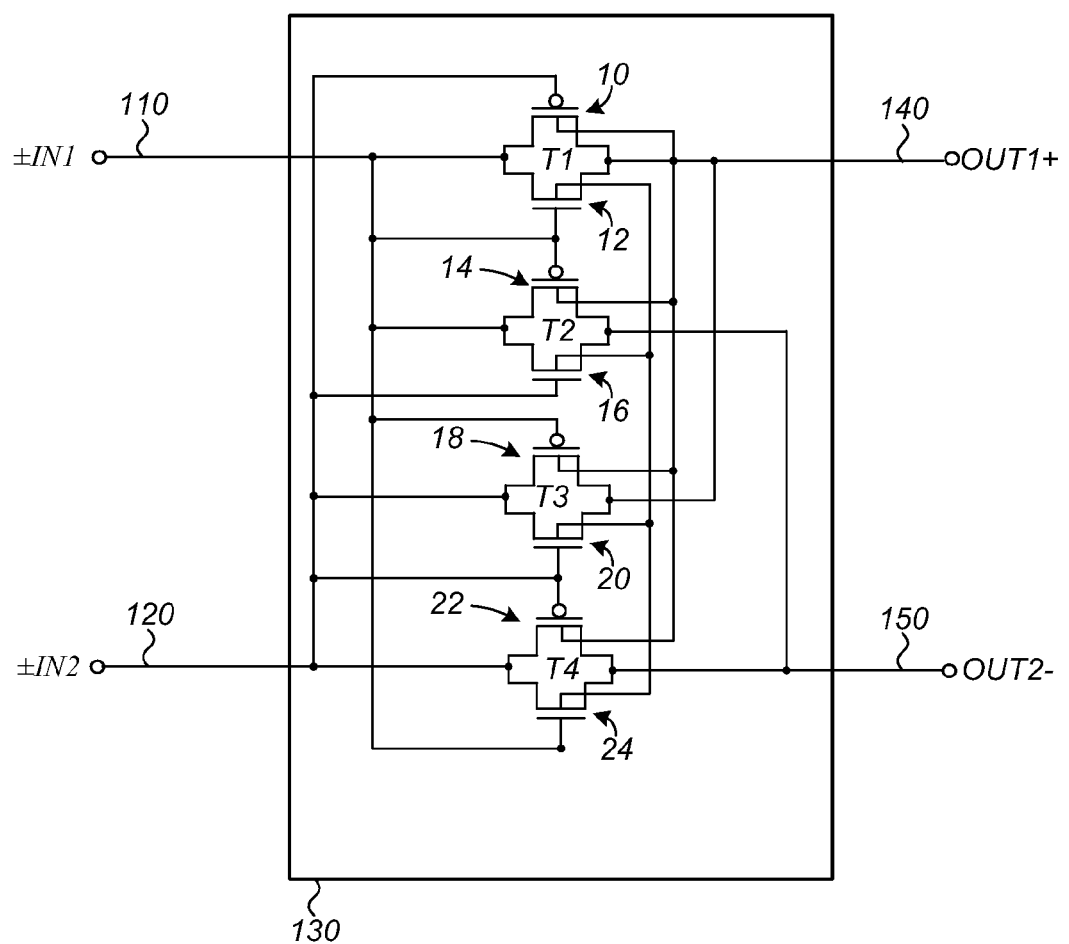
FIG. 1 illustrates a conventional automatic polarity transfer circuit.
Figure 2:
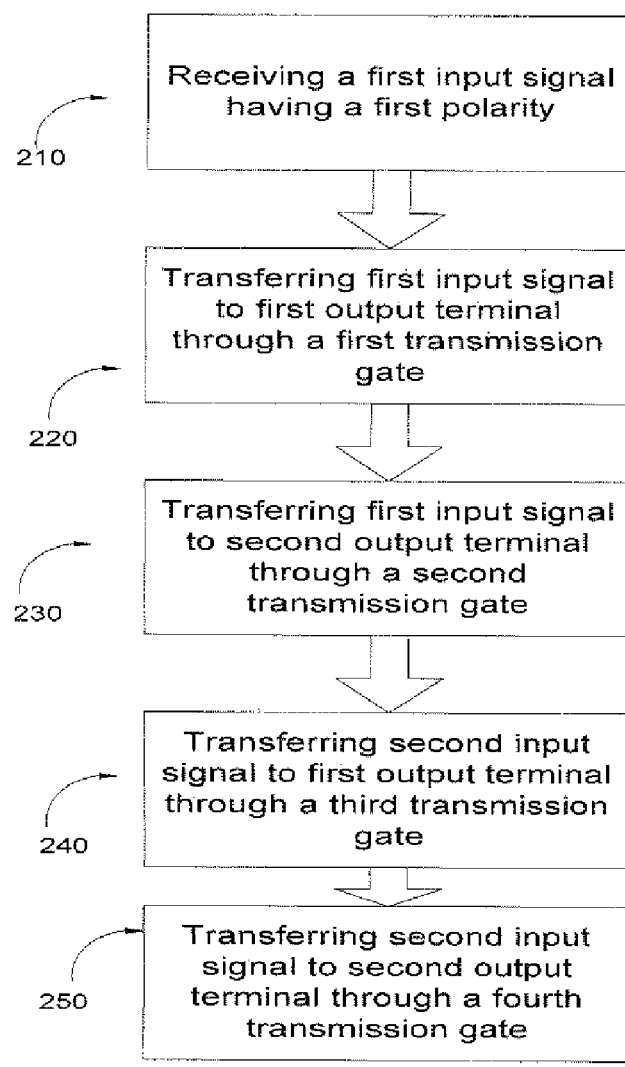
FIG. 2 illustrates a method of operating a conventional automatic polarity transferring circuit.
Figure 3:
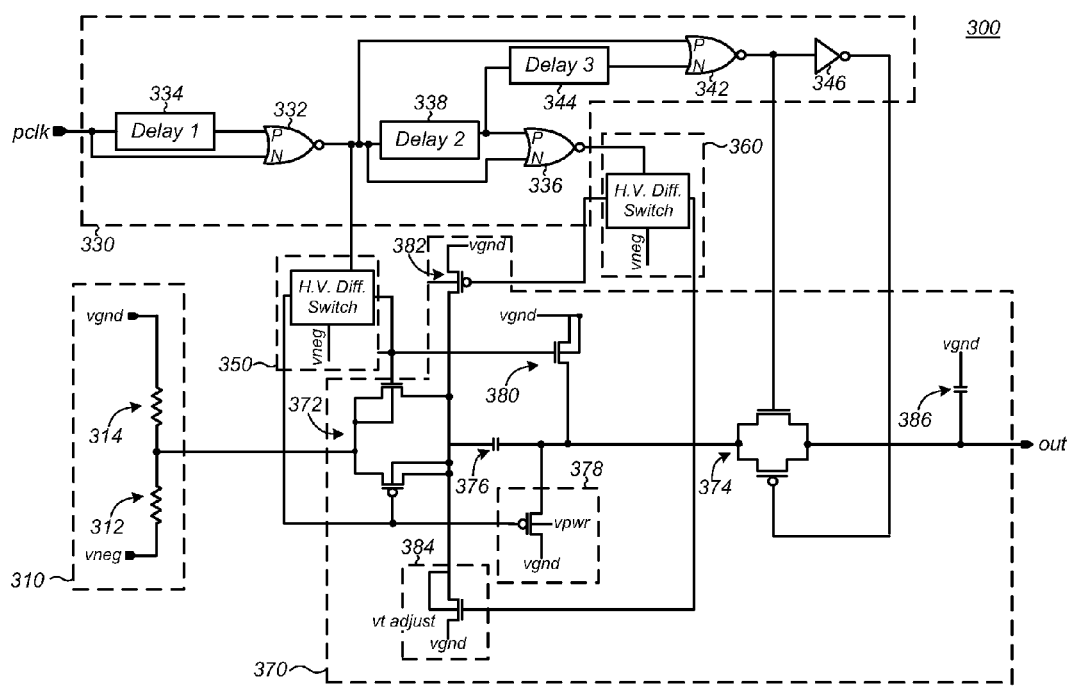
FIG. 3 illustrates an improved process, voltage and temperature compensated polarity conversion circuit.

The improved PVT compensated polarity conversion circuit of FIG. 3 comprises high voltage switches and delay elements for controlling the transition of positive charge and negative charge to change the polarity of the input voltage. The transition from negative to positive voltage or positive to negative voltage is accomplished by using transmission gates. The transmission gates comprise a threshold adjustment circuit for minimizing output voltage variation over changes in Process, Voltage or Temperature (PVT). The transmission gates require differential inputs from high voltage switches to ensure proper operation.

Referring to FIG. 3, a PVT compensated polarity conversion circuit 300 is shown, which comprises an input signal generator 310, a variable frequency generator 330, a first high voltage differential switch 350, a second high voltage differential switch 360 and a controllable threshold transmission gate circuit 370 connected to each other. The controllable threshold transmission gate circuit comprises controlled capacitance terminals. A negative reference supply voltage vneg or a negative polarity (−) input signal vneg (an increase indicates an increase on −x or −y axis of a two dimensional graph) is applied to the PVT compensated polarity conversion circuit 300 besides a grounded node voltage vgnd and an external digital frequency source (pclk or clock signal).

The input signal generator 310 comprises a first resistor 312 coupled to a second resistor 314 forming a resistor-divider network. A first end of the resistor divider network is fed with vneg and a second end is fed with vgnd.

The variable frequency generator 330 is fed with the external digital frequency source and it comprises the following. A first frequency generator 331 (not pointed out in the Figure), a second frequency generator 335 (not pointed out in the Figure) and a third frequency generator 341 (not pointed out in the Figure) coupled to each other. The first frequency generator 331 comprises a two input NOR gate 332. A delay element 334 is coupled at a first input terminal of the two input NOR gate 332. The second frequency generator 335 comprises a two input NOR gate 336. A delay element 338 is coupled at a first input of the two input NOR gate 336. The third frequency generator 341 comprises a two input NOR gate 342. A delay element 344 is coupled at a first input of the two input NOR gate 342 and an inverter 346 is coupled to an output of the two input NOR gate 342. The delay elements 334, 338 and 344 and NOR gates 332, 336 and 342 of the variable frequency generator 330 generate sequential digital signals for enabling the high voltage differential switches (350 and 360) and the controllable threshold transmission gate circuit 370 sequentially to thereby achieve PVT controlled polarity conversion.

Both the first high voltage differential switch 350 and the second high voltage differential switch 360 comprise a plurality of Metal Oxide Semiconductor (MOS) transistors coupled to each other in a differential configuration. There should be at least one differential pair in each switch. A first signal and a second signal are applied to each of the first high voltage differential switch 350 and the second high voltage differential switch 360, wherein the first signal is differential with respect to the second signal.

The controllable threshold transmission gate 370 circuit comprises a first Metal Oxide Semiconductor (MOS) transmission gate 372. A second MOS transmission gate 374 is coupled to the first MOS transmission gate 372 through a capacitor 376. A first PMOS (P-channel type MOS) transistor 378 is coupled to a first control terminal of the first MOS transmission gate 372. A first NMOS (N-channel type MOS) transistor 380 is coupled to a second control terminal of the first MOS transmission gate 372 and coupled to the first high voltage differential switch 350. A second PMOS transistor 382 is coupled to an output node of the first MOS transmission gate 372 and is coupled to the second high voltage differential switch 360. A second NMOS transistor 384 is coupled to the output node of the first MOS transmission gate. The controllable threshold transmission gate 370 circuit further comprises a load capacitor 386 coupled to an output node of the second MOS transmission gate 374.

Each of the first transmission gate 372 and the second transmission gate 374 comprises MOS transistors (PMOS and NMOS) as switches. A MOS transistor essentially is a four terminal device comprising a source terminal, a drain terminal, a gate terminal (control) and a bulk or substrate. The source to drain terminal path of the MOS transistor is a transmission path of the first MOS transmission gate 372 and a control signal applied at a gate terminal switches this path between a high and a low impedance state.

The first PMOS transistor 378 and the first NMOS transistor 380 form a first operating voltage adjustment circuit (may also be referred to as a transmission gate operating voltage adjustment circuit). The second PMOS transistor 382 and the second NMOS transistor 384 together form a second operating voltage adjustment circuit (may also be referred to as transmission gate operating voltage adjustment circuit). Each of the first MOS transmission gate 372 and second MOS transmission gate 374 comprises a PMOS transistor and a NMOS transistor coupled to each other. The capacitor 376 is either an NMOS device or a PMOS device configured as a capacitor with drain, source and bulk connected together. The capacitor 376 may also be constructed with metal, local interconnect, poly or any other means to construct a capacitor.

In a first step, the second PMOS transistor 382 and the second NMOS transistor 384 support the threshold voltage adjustment triggered by the PMOS and NMOS transistors of the first MOS transmission gate 372. In a second step, the first PMOS transistor 378 and the first NMOS transistor 380 provide the enable signal to the transmission gate 372 and control charging and discharging of the capacitor 376. The first PMOS transistor 378 and second PMOS transistor 382 are dual gate MOS transistors. The first NMOS transistor 380 and the second NMOS transistor 384 are bulk to source connected MOS transistors.

Interconnection among the input signal generator 310, the variable frequency generator 330, the first high voltage differential switch 350, the second high voltage differential switch 360 and the controllable threshold transmission gate circuit 370 is detailed as follows.

In a first step, an output of the first frequency generator is applied to an input terminal of the first high voltage differential switch 350 responsive to a digital input signal (pclk). In a second step, an output from the second frequency generator is applied to the second high voltage differential switch 360. In a third step, an output from the two input NOR gate 342 of the third frequency generator is applied to a first control terminal of the second MOS transmission gate 374. In a fourth step, an output from the inverter 346 is applied to a second control terminal of the second MOS transmission gate 374.

The first resistor 312 of the input signal generator 310 is coupled to the negative reference supply voltage (vneg) and the second resistor 314 is coupled to the grounded node supply voltage (vgnd). A voltage reference is generated from an output of the input signal generator 310, wherein the voltage reference has a negative polarity (−).

The voltage reference is applied to an input terminal of the first MOS transmission gate 372, wherein a first control terminal and a second control terminal of the first MOS transmission gate 372 are fed with an output signal from the first high voltage differential switch 350. The first control terminal and the second control terminal are also coupled to a gate terminal of the first PMOS transistor 378 and the first NMOS transistor 380. An output terminal of the first MOS transmission gate 372 is coupled to a first terminal of the capacitor 376. A second terminal of the capacitor 376 is coupled to a common node of the first PMOS transistor 378 and the first NMOS transistor 380.

The second terminal of the capacitor 376 is also coupled to an input terminal of the second MOS transmission gate 374 through the common node of the first PMOS transistor 378 and the first NMOS transistor 380. An output terminal of the second MOS transmission gate 374 is coupled to a grounded node through the load capacitor 386 and is also coupled to an output node (out) for generating an output signal, which has a polarity converse of the voltage reference. The first control terminal of the second MOS transmission gate 374 is coupled to the output of the two input NOR gate 342 and the second control terminal of the second MOS transmission gate 374 is coupled to the output of the inverter 346.

The first operating voltage adjustment circuit, which is constituted by the PMOS transistor 378 and the NMOS transistor 380, is responsible for providing a regulated voltage (vpwr) to the first MOS transmission gate 372 and providing partial (a plate of a parallel plate capacitor) charging or discharging to the capacitor 376. The PMOS transistor 378 may be a dual gate MOS transistor and NMOS transistor 380 may be a bulk to source/drain coupled transistor.

The second operating voltage adjustment circuit, which is constituted by the PMOS transistor 382 and the NMOS transistor 384, is responsible for supporting threshold adjustment of the first MOS transmission gate 372 and for providing partial charging or discharging (a plate of a parallel plate capacitor) to the capacitor 376. The PMOS transistor 382 may be a dual gate MOS transistor and the NMOS transistor 384 may be a bulk to source/drain coupled transistor.

The transistors 378 and 380 are coupled to the control terminals of the first MOS transmission gate 372. The transistors 382 and 384 are coupled to the output node of the first MOS transmission gate 372.

For the NMOS transistors used in controllable threshold transmission gate circuit 370 the bulk is tied to lowest potential. For the PMOS transistors of the circuit 370, the bulk is tied to highest potential to thereby avoid forward biasing of parasitic bipolars.

For making the polarity conversion process independent of variations in Process, Voltage and Temperature (PVT). Transistors of the first MOS transmission gate 372 should have equal and opposite (since bulk to drain voltages dynamically change) values of a Gate to Source capacitance (Cgs) and a Gate to Drain capacitance (Cgd). This is accomplished by adjusting threshold voltage of devices that make up the first MOS transmission gate 372.

Threshold voltage for a MOS transistor is defined as a voltage applied between a gate terminal and a source terminal of the MOS transistor, below which the drain to source current Ids effectively drops to zero. The threshold voltage is dependent on gate conductor material, gate insulation material, gate insulator thickness-channel doping, impurities at silicon-insulator interface and voltage between source and the substrate. Doping of the substrate is also termed as bulk potential. The threshold voltage can be varied by varying the doping concentration of the substrate. The threshold voltage can be enhanced by applying heavily doped diffusions to the substrate.

It is a characteristic of the MOS transistor that a first parasitic capacitor between the gate terminal and the source terminal (Cgs) is realized and a second parasitic capacitor between the gate terminal and drain terminal (Cgd) is realized. In an off mode of the MOS transistor Cgs and Cgd are zero. In a non-saturated mode of the MOS transistor Cgs and Cgd become significant. In a saturated mode Cgs is further increased. The Cgs and Cgd can be controlled by adjusting the threshold voltage.

MOS transistor gain factor ($\beta$) is a factor that can adjust the threshold voltage of the MOS transistor. The MOS transistor gain factor is inversely proportional to channel length and directly proportional to channel width of the MOS transistor. Thus, by varying the channel width or channel length, the MOS transistor gain factor can be controlled.

For adjusting the threshold voltage of the first MOS transmission gate 372 and second MOS transmission gate 374, a channel width ($\beta$) of the PMOS and NMOS transistors constituting the transmission gates (372 and 374) may be adjusted to thereby achieve similar Cgs and Cgd in the non-saturation and saturation modes. For achieving the threshold voltage adjustment bulk to source connected PMOS and NMOS transistors (MOS transistors of 372 and NMOS transistors 380 and 384) are preferably used for constructing MOS transmission gates. In a bulk to source connected MOS transistor bulk (substrate) is connected to source terminal of the MOS transistor to avoid forward biasing of parasitic bipolars of the MOS transistor. Thus, there is a zero source to bulk voltage (Vsb=0) and no body effected threshold voltage is generated.

Thus, a polarity conversion method and circuit, which is independent of Process. Voltage and Temperature variations, can be devised.

Figure 4:
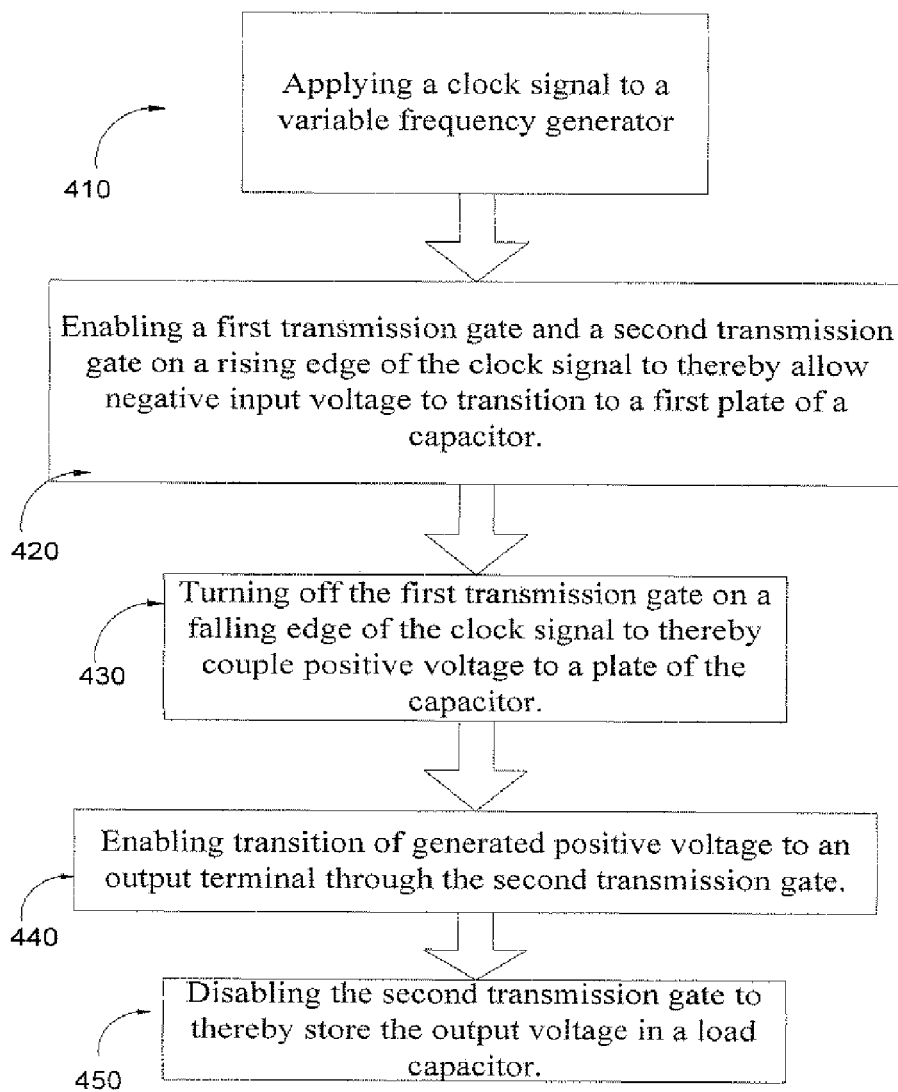
FIG. 4 illustrates a method for Process, Voltage and Temperature (PVT) compensated polarity conversion.

Referring to FIG. 4, a flow chart 400 illustrates a method for Process, Voltage and Temperature (PVT) compensated polarity conversion. The steps of the method are described as follows.

In a first step 410, a clock signal is applied to a variable frequency generator 330. In a second step 420, on a rising edge of the clock signal a first transmission gate 372 and a second transmission gate 374 are enabled allowing a negative input voltage to transition to a first plate of a capacitor 376. A second plate of the capacitor 376 is discharged to ground through a second transmission gate 374. In a third step 430, on a falling edge of the clock signal the first transmission gate 372 turns off and a NMOS device 384 discharges the first plate of the capacitor 376 to ground and isolates the second plate of the capacitor 376. Thus, the second plate of the capacitor 376 is floating. The positive voltage change (negative to ground) is coupled in to the second plate and a polarity transfer takes place, which is of the same magnitude but of opposite polarity to the negative input voltage. In a fourth step 440, on the falling edge of the clock signal, the second transmission gate 374 is enabled, which allows generated positive voltage to transition to an output terminal. In a fifth step 450, the second transmission gate 374 is disabled and the load capacitor 386 is made to hold the output voltage. In a further embodiment, a positive input voltage can be converted to a negative equivalent by applying steps first through fifth.

Figure 5:
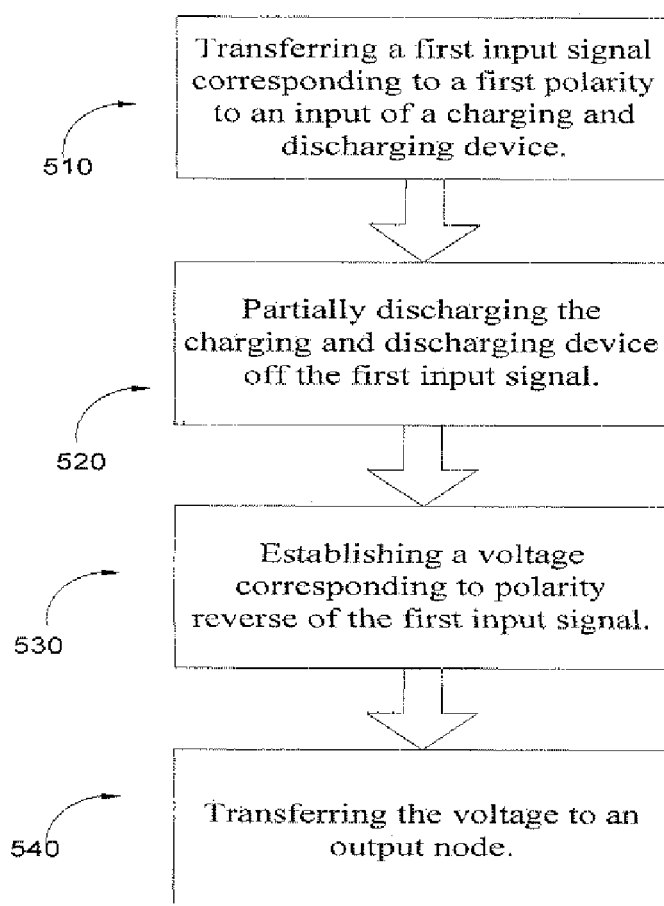
FIG. 5 illustrates a method for changing a polarity of an input signal.

In an embodiment, operation of the Process, Voltage and Temperature (PVT) compensated polarity conversion circuit 300 is described. Referring to FIG. 5, a flow chart 500 illustrates the operation in detail.

In a first step 510, a first input signal corresponding to a first polarity is transferred to an input of charging and discharging device, wherein properties of the first input signal are made free of electromechanical variations while being transferred. The first step 510 comprises a sub-step of enabling a first threshold voltage controlled MOS transmission gate and a second threshold voltage controlled transmission gate. The sub step of enabling is followed by charging the charging and discharging device with the first input signal corresponding to the first polarity. The electromechanical variations pertain to process, voltage and temperature variations.

In a second step 520, the charging and discharging device is partially discharged off the first input signal corresponding to the first polarity. The second step 520 comprises sub-steps of disabling the first threshold voltage controlled MOS transmission gate and applying MOS transistor controlled discharge to a plate of the charging and discharging device. In a third step 530, the charging and discharging device establishes voltage corresponding to polarity reverse of the first input signal. The third step 530 comprises a sub step of coupling a charge to a plate of the charging and discharging device. In a fourth step 540, a second input signal corresponding to the established voltage is transferred to an output node, wherein properties of the first input signal are made free of electromechanical variations while being transferred. The electromechanical variations pertain to process, voltage and temperature variations. The fourth step 540 comprises a sub-step of enabling a second threshold voltage controlled MOS transmission gate.

Thus, a negative polarity (−) input signal or a negative reference supply voltage is converted to a positive polarity (+) output signal by the process, voltage and temperature compensated polarity conversion circuit. The steps 510-540 may be repeated for several cycles of an input signal of which the first input signal is a constituent.

The method for changing polarity of an input signal further comprises generating variable frequency to thereby enable the MOS transmission gates and charging and discharging device in a sequential manner and holding the output signal in the load capacitor 386.

In an embodiment of the invention the input signal generator 310 generates a positive polarity (+) input signal or a positive reference supply voltage, which is converted to a negative polarity (−) output signal or a negative reference supply voltage. A first end of the resistor divider network (resistor 312 and resistor 314) is fed with vpos (positive reference supply voltage) and a second end is fed with vgnd.

Embodiments of the present invention are well suited to performing various other steps or variations of the steps recited herein, and in a sequence other than that depicted and/or described herein. In one embodiment, such a process is carried out by processors and other electrical and electronic components, e.g., executing computer readable and computer executable instructions comprising code contained in a computer usable medium.

For purposes of clarity, many of the details of the improved polarity conversion circuit and the methods of designing and manufacturing the same that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A circuit, comprising:
    a plurality of high voltage differential switches coupled to a variable frequency generator;
    and a controllable threshold transmission gate circuit coupled to an input signal having a first polarity, coupled to the variable frequency generator and coupled to the plurality of high voltage differential switches, wherein the controllable threshold transmission gate circuit comprises a first transmission gate and a second transmission gate coupled to the first transmission gate through a capacitor.

2. The circuit of claim 1, wherein the controllable threshold transmission gate circuit further comprises:
    a first PMOS transistor coupled to a first control terminal of the first transmission gate;
    a first NMOS transistor coupled to a second control terminal of the first transmission gate;
    a second PMOS transistor coupled to an output node of the first transmission gate; and
    a second NMOS transistor coupled to the output node of the first transmission gate.

3. The circuit of claim 2, wherein the first transmission gate comprises a bulk to source connected PMOS transistor coupled to bulk to source connected NMOS transistor and the second transmission gate comprises a PMOS transistor coupled to a NMOS transistor.

4. The circuit of claim 2 wherein each of the first NMOS transistor and the second NMOS transistor comprises a bulk to source connected NMOS transistor.

5. The circuit of claim 2, wherein each of the first PMOS transistor and the second PMOS transistor comprises a dual gate PMOS transistor.

6. The circuit of claim 2 wherein each of the first NMOS transistor and second NMOS transistor is coupled to the capacitor at a first terminal and a grounded node at a second terminal.

7. A device, comprising:
an input signal generator comprising an input signal;
a plurality of high voltage differential switches coupled to a variable frequency generator;
and a controllable threshold transmission gate circuit coupled to the input signal generator, coupled to the variable frequency generator and coupled to the plurality of high voltage differential switches, wherein the controllable threshold transmission gate circuit comprises a first transmission gate and a second transmission gate coupled to the first transmission gate through a capacitor.

8. The device of claim 7, wherein the input signal generator comprises a resistor divider circuit.

9. The device of claim 7, wherein the variable frequency generator, comprises:
a first frequency generator;
a second frequency generator coupled to an output of the first frequency generator; and
a third frequency generator coupled to an output of the second frequency generator.

10. The device of claim 9, wherein each of the first frequency generator, the second frequency generator and the third frequency generator comprises a two input NOR gate, wherein a first input the two input NOR gate is coupled to a digital frequency source and a delay element coupled between the digital frequency source and the two input NOR gate.

11. The device of claim 7, wherein the plurality of differential high voltage switches comprises a first high voltage differential switch and a second high voltage differential switch.

12. The device of claim 11, wherein each of the first high voltage differential switch and second high voltage differential switch are Metal Oxide Semiconductor (MOS) high voltage differential switches.

* * * * *